United States Patent
Chen

(10) Patent No.: US 9,876,055 B1
(45) Date of Patent: Jan. 23, 2018

(54) THREE-DIMENSIONAL SEMICONDUCTOR DEVICE AND METHOD FOR FORMING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/367,390

(22) Filed: Dec. 2, 2016

(51) Int. Cl.
H01L 27/24 (2006.01)
H01L 45/00 (2006.01)

(52) U.S. Cl.
CPC ........ H01L 27/249 (2013.01); H01L 27/2409 (2013.01); H01L 45/06 (2013.01); H01L 45/1226 (2013.01); H01L 45/1683 (2013.01)

(58) Field of Classification Search
CPC ............. H01L 27/2409; H01L 45/1226; H01L 45/1683; H01L 45/06; H01L 27/249
See application file for complete search history.

(56) References Cited

U.S. PATENT DOCUMENTS

| | | | |
|---|---|---|---|
| 2004/0124466 A1 | 7/2004 | Walker et al. | |
| 2006/0126395 A1 | 6/2006 | Chen et al. | |
| 2010/0109071 A1* | 5/2010 | Tanaka | H01L 27/11582 257/324 |
| 2010/0271862 A1 | 10/2010 | Yoon et al. | |
| 2011/0220980 A1* | 9/2011 | Parekh | G11C 11/405 257/302 |
| 2012/0147689 A1 | 6/2012 | Scheuerlein et al. | |
| 2012/0153247 A1* | 6/2012 | Baek | H01L 27/249 257/2 |
| 2012/0161094 A1* | 6/2012 | Huo | H01L 27/249 257/4 |
| 2014/0312296 A1* | 10/2014 | Jo | G11C 13/0007 257/4 |

(Continued)

FOREIGN PATENT DOCUMENTS

| | | |
|---|---|---|
| CN | 1797768 A | 7/2006 |
| TW | 1260764 B | 8/2006 |

*Primary Examiner* — Thomas L Dickey
*Assistant Examiner* — Farid Khan
(74) *Attorney, Agent, or Firm* — McClure, Qualey & Rodack, LLP

(57) ABSTRACT

A three-dimensional semiconductor device includes a multi-layered stack structure with memory layers parallel to each other and separated by interlayer insulation layers; and memory cell structures formed at each memory layer by arranging in a multi-row and multi-column array. One memory cell structure includes a memory material layer; a selector layer formed at an outer surface of the memory material layer and connected to the memory material layer; a first electrode layer formed at an outer surface of the selector layer and electrically connected to the selector layer; and a second electrode layer formed at an inner surface of the memory material layer and connected to the memory material layer, wherein the second electrode layer penetrates the multi-layered stack structure. Each memory layer includes a conductive layer electrically connecting the first electrode layer and the conductive layer electrically connects the adjacent memory cell structures.

16 Claims, 18 Drawing Sheets

(56) References Cited

U.S. PATENT DOCUMENTS

| | | |
|---|---|---|
| 2015/0179705 A1 | 6/2015 | Wouters et al. |
| 2015/0187415 A1 | 7/2015 | Ko |
| 2015/0333103 A1 | 11/2015 | Toh et al. |
| 2015/0340406 A1* | 11/2015 | Jo .................. H01L 45/141 29/604 |
| 2016/0005969 A1 | 1/2016 | Sasago et al. |
| 2016/0049201 A1 | 2/2016 | Lue et al. |
| 2016/0133836 A1 | 5/2016 | Lan et al. |

* cited by examiner

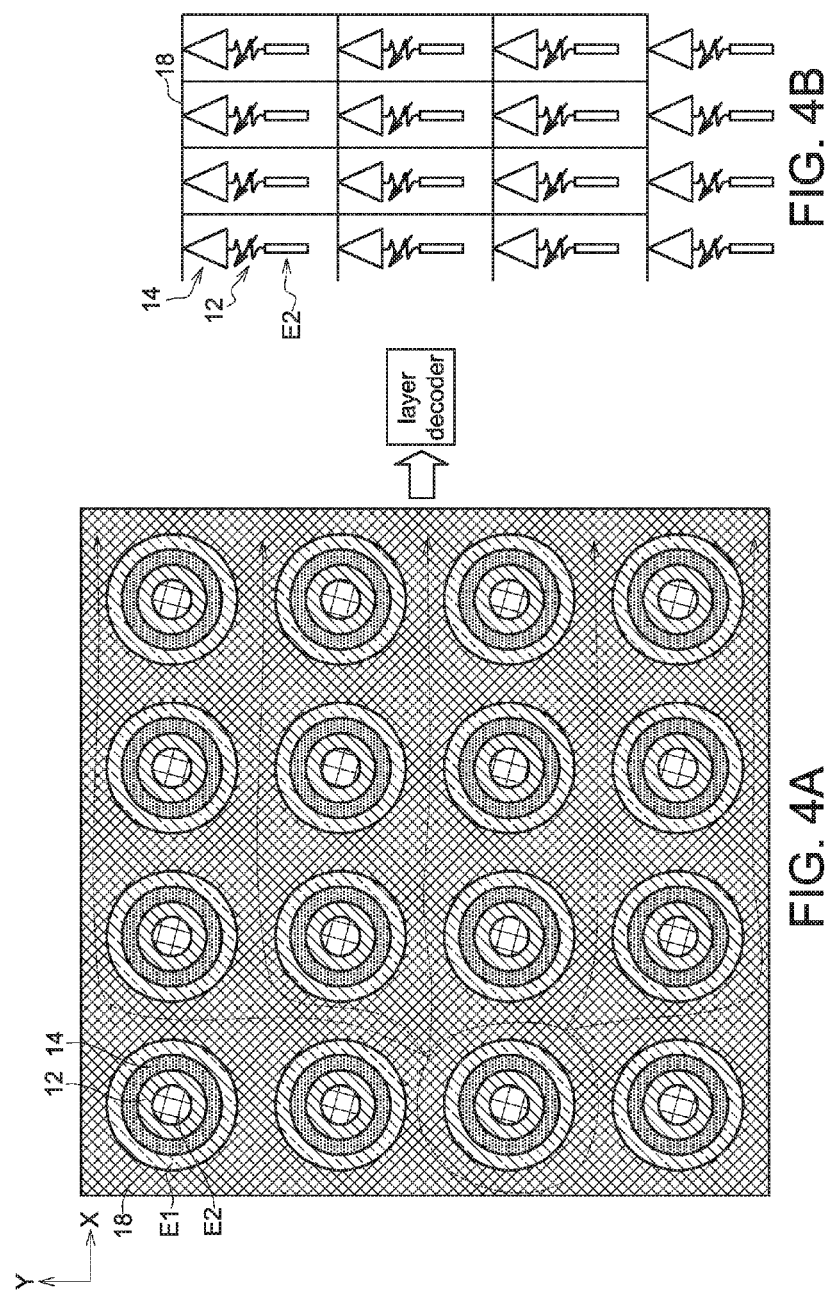

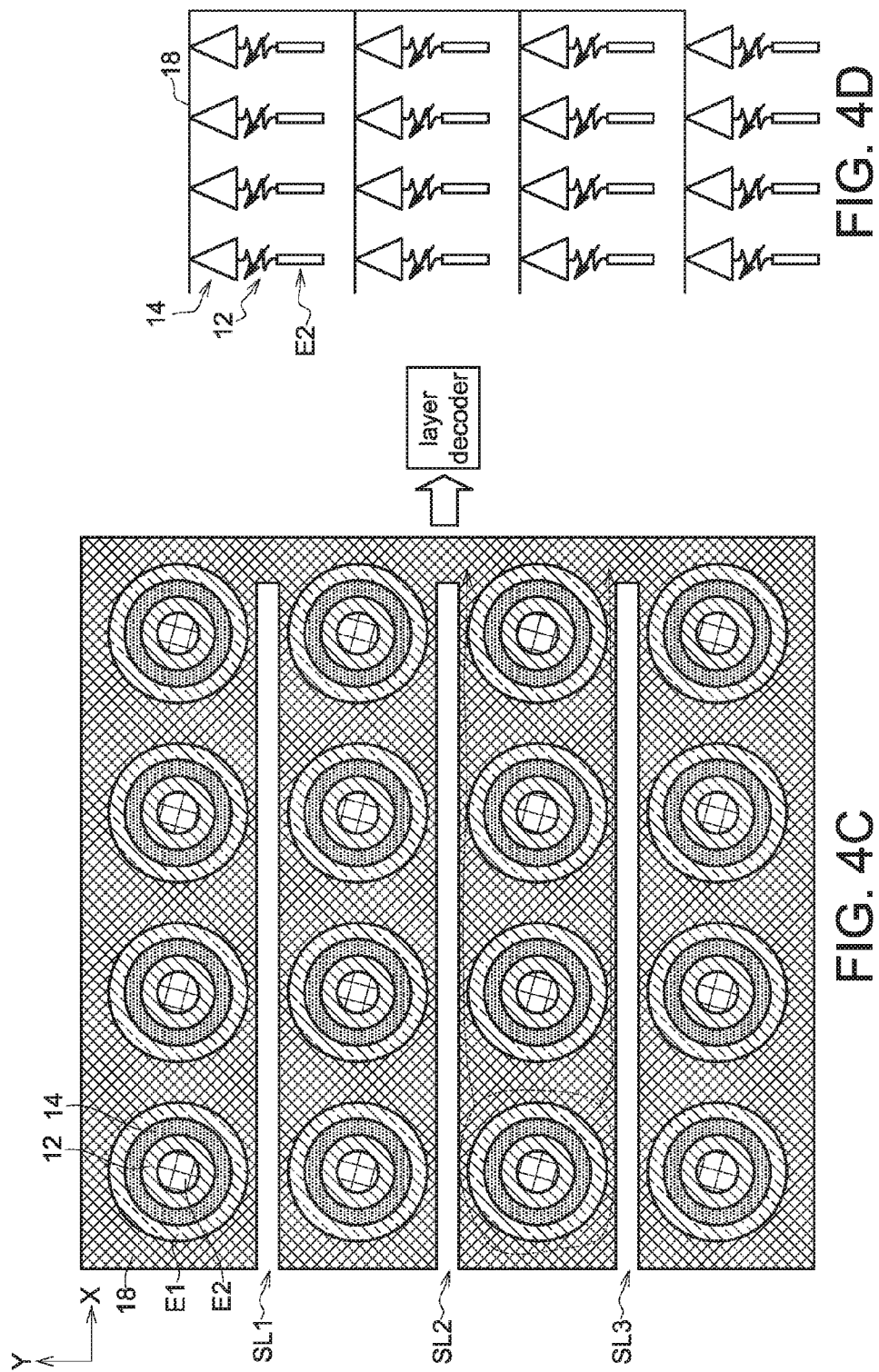

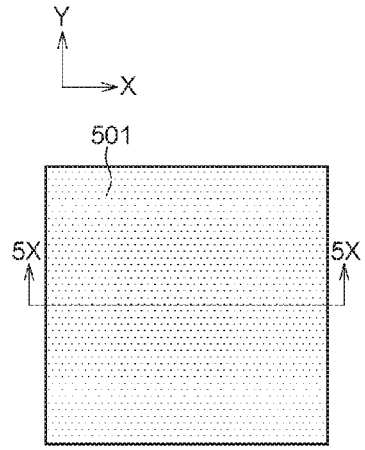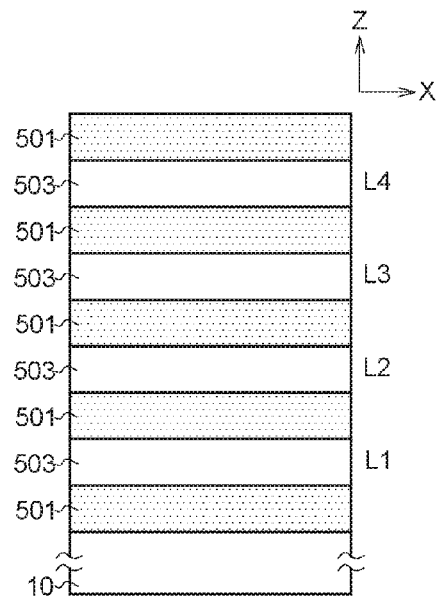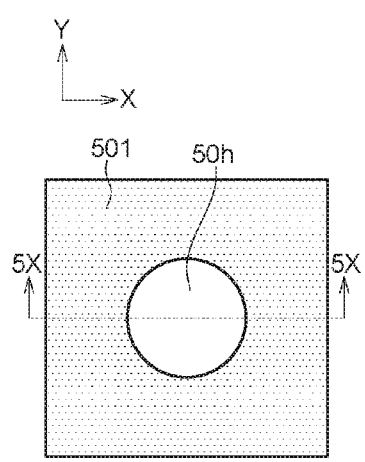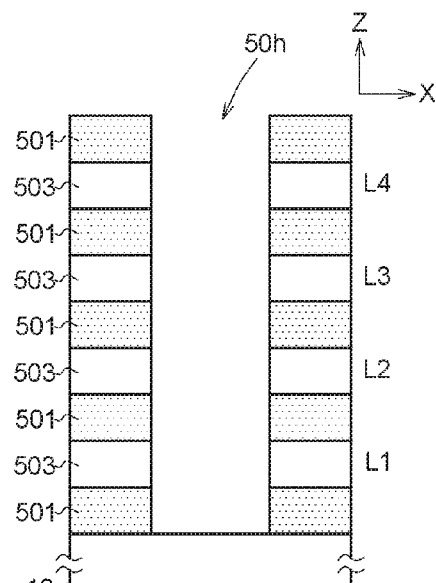

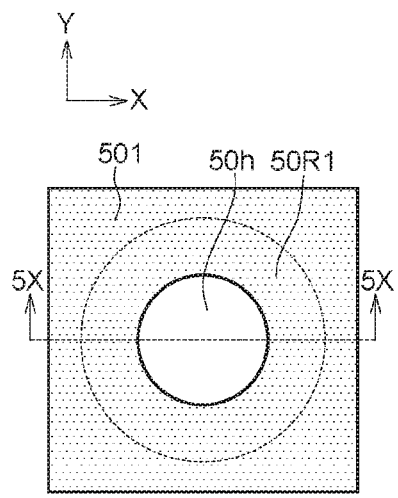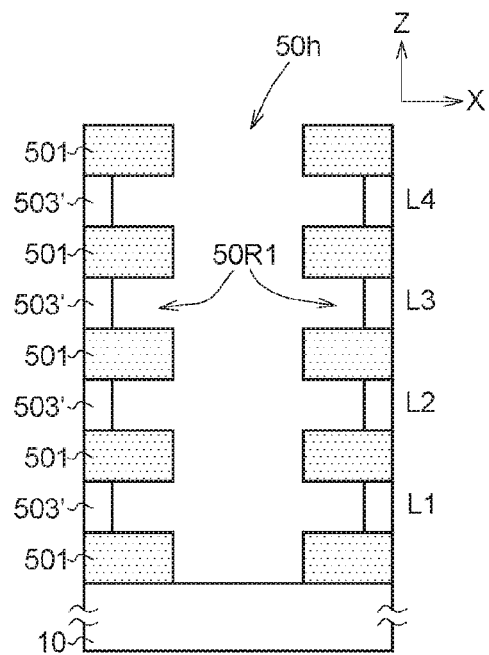
FIG. 7A  FIG. 7B
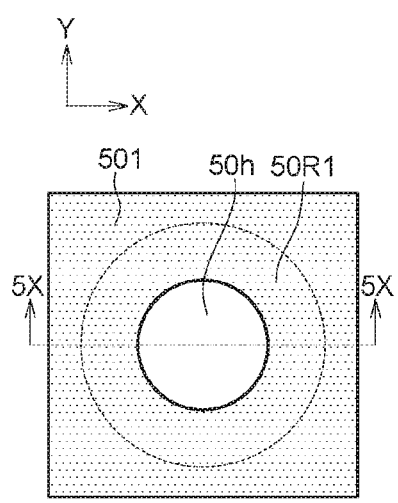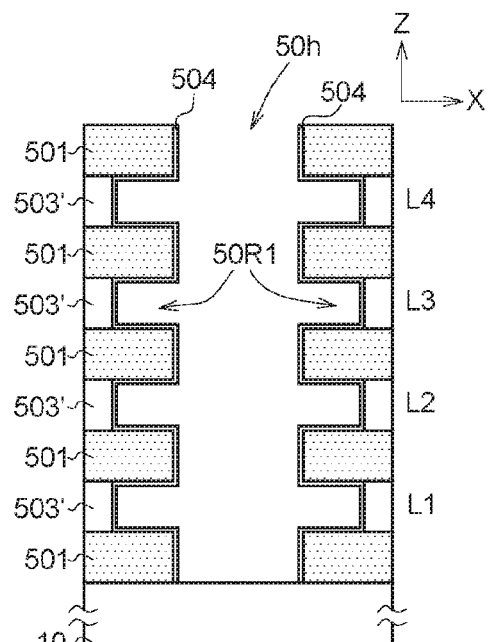
FIG. 8A  FIG. 8B

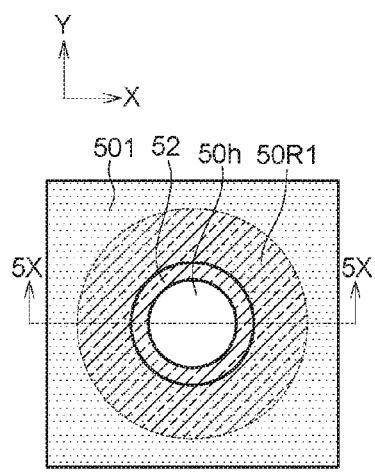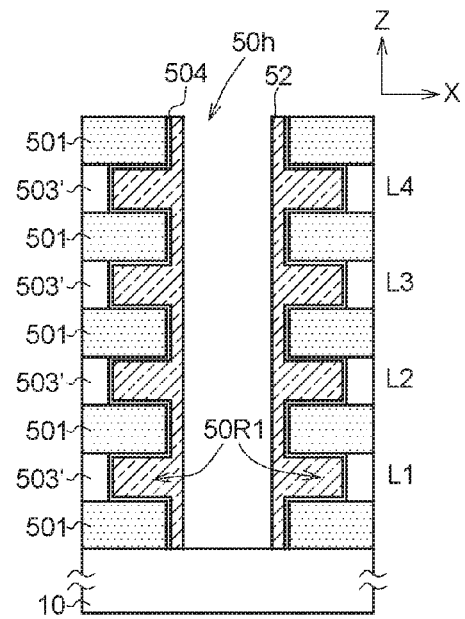
FIG. 9A  FIG. 9B
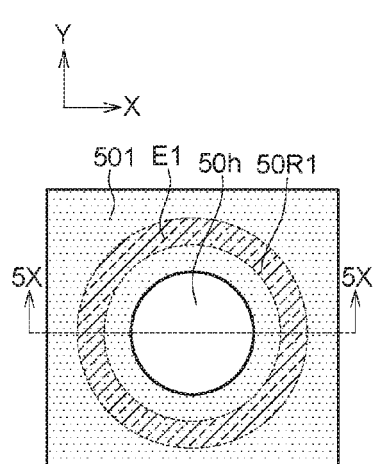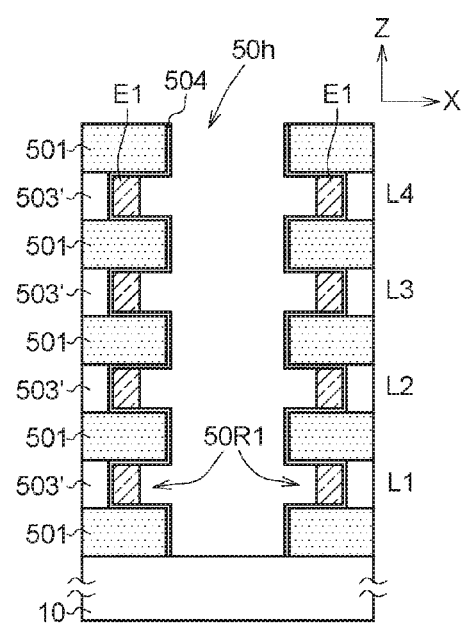
FIG. 10A  FIG. 10B

THREE-DIMENSIONAL SEMICONDUCTOR DEVICE AND METHOD FOR FORMING THE SAME

BACKGROUND

Field of the Invention

The disclosure relates in general to a semiconductor device and method for forming the same, and more particularly to a three-dimensional (3D) semiconductor device and method for forming the same.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. No matter what types of the three-dimensional (3D) semiconductor device containing multi-layer stacked memory cell structures are proposed, it is desirable to develop a structure with good reliability and excellent electrical properties during operation. For example, heat accumulation or too much heat generation would reduce the reliability of the related elements of the memory cell structures and also induce extra power consumption.

SUMMARY

The disclosure relates to a three-dimensional (3D) semiconductor device and method for forming the same. According to the embodied structures of the 3D semiconductor devices, the reliability and performance of the 3D semiconductor device during operation can be significantly improved.

According to the present disclosure, a three-dimensional (3D) semiconductor device is provided, comprising a multi-layered stack structure formed above a substrate and comprising memory layers parallel to each other and separated by interlayer insulation layers; and memory cell structures formed at each of the memory layers by arranging in an array with multi-rows and multi-columns. One of the memory cell structures comprises a memory material layer; a selector layer formed at an outer surface of the memory material layer and connected to the memory material layer; a first electrode layer (E1) formed at an outer surface of the selector layer and electrically connected to the selector layer; and a second electrode layer (E2), formed at an inner surface of the memory material layer and connected to the memory material layer, wherein the second electrode layer (E2) is formed to penetrate the multi-layered stack structure and extended in a vertical direction with respect to the substrate. Also, each of the memory layers comprises a conductive layer electrically connecting the first electrode layer, and the conductive layer electrically connects the adjacent memory cell structures by extending in a parallel direction with respect to the substrate.

According to the present disclosure, a method of forming a 3D semiconductor device is provided, comprising providing a substrate, and forming a multi-layered stack structure above the substrate. The multi-layered stack structure comprises memory layers parallel to each other and separated by interlayer insulation layers, wherein memory cell structures are formed at each of the memory layers by arranging in an array with multi-rows and multi-columns. Steps for forming one of the memory cell structures comprise forming a first electrode layer (E1) in a first recess region at each of the memory layers; forming a selector layer in the first recess region at each of the memory layers, and the selector layer formed at an inner surface of the first electrode layer and connected to the first electrode layer; forming a memory material layer at an inner surface of the selector layer and electrically connected to the selector layer; and forming a second electrode layer (E2) at an inner surface of the memory material layer and connected to the memory material layer, wherein the second electrode layer (E2) is formed to penetrate the multi-layered stack structure and extended in a vertical direction with respect to the substrate. Also, the method further includes forming a conductive layer in a second recess region at each of the memory layers, and the conductive layer electrically connecting the first electrode layer, wherein the conductive layer electrically connects the adjacent memory cell structures by extending in a parallel direction with respect to the substrate.

The disclosure will become apparent from the following detailed description of the preferred but non-limiting embodiments. The following description is made with reference to the accompanying drawings.

BRIEF DESCRIPTION OF THE DRAWINGS

FIG. 4A—is a top view of a memory layer of a multi-layered stack structure according to one embodiment of the disclosure.

FIG. 4B is an equivalent circuit diagram of FIG. 4A.

FIG. 4C is a top view of another memory layer of a multi-layered stack structure according to one embodiment of the disclosure.

FIG. 4D is an equivalent circuit diagram of FIG. 4C.

FIG. 5A-FIG. 20B depict a method for forming a 3D semiconductor device according to one embodiment of the disclosure, wherein the figures labeled with "A" represent the configurations from the top view, and the figures labeled With "B" represent the configurations from the cross-sectional view.

DETAILED DESCRIPTION

Figure 1A:
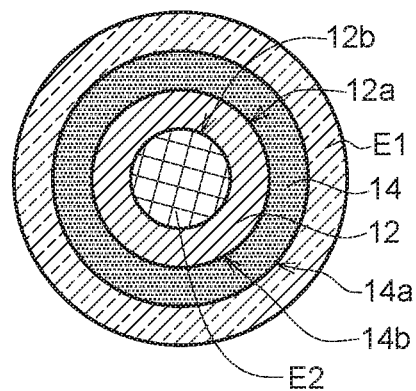
FIG. 1A is a top view of one memory cell structure of a three-dimensional (3D) semiconductor device according to one embodiment of the present disclosure.

The embodiments of the present disclosure disclosed below are for elaborating a three-dimensional (3D) semiconductor device and the method of forming the same. According to the 3D semiconductor devices of the embodiments, the selector layer of the memory cell structure is disposed at the outside of the memory material layer, and the heat generation of the selectors can be reduced, thereby significantly improving the reliability and performance of the 3D semiconductor device during operation. Also, according to the 3D semiconductor devices of the embodiments, the adjacent memory cell structures in the same memory layer, such as the memory cell structures arranged in the same row or arranged in an array with multi-rows and multi-columns, are electrically connected by a conductive layer (such as a metal layer) for providing more current paths to the selected memory cell, thereby decreasing the loading (resistance R) during operation.

The embodiments can be applied to various applications with different memory cell arrays of 3D semiconductor devices, and the disclosure does not limit the applicable types and materials of the memory material layer and the selector layer. Several embodiments are provided hereinafter with reference to the accompanying drawings for describing the related configurations of memory cell structure and the method for manufacturing the same. Related structural details, such as layers and spatial arrangement, are further described in the embodiments as below. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1A is a top view of one memory cell structure of a 3D semiconductor device according to one embodiment of the present disclosure. A memory cell structure includes a memory material layer 12, a selector layer 14, a first electrode layer E1 and a second electrode layer E2. The selector layer 14 is formed at an outer surface 12a of the memory material layer 12 and electrically connected to the memory material layer 12. The first electrode layer E1 is formed at an outer surface 14a of the selector layer 14 and electrically connected to the selector layer 14. The second electrode layer E2 is formed at an inner surface 12b of the memory material layer 12 and electrically connected to the memory material layer 12. Configuration of the memory cell structure is not limited to the ring shape (FIG. 1A), other shapes of the memory cell structures can be applicable in the embodiments.

Figure 1B:
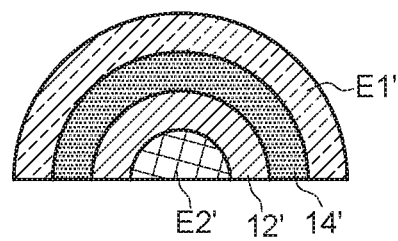
FIG. 1B is a top view of another memory cell structure of a three-dimensional (3D) semiconductor device according to one embodiment of the present disclosure.
Figure 1C:
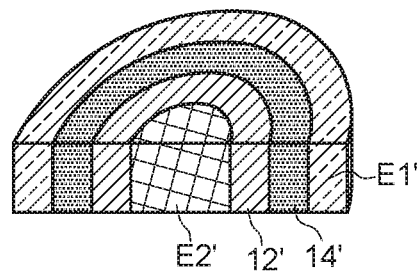
FIG. 1C is a bird's eye view of the memory cell structure of FIG. 1B.

FIG. 1B is a top view of another memory cell structure of a 3D semiconductor device according to one embodiment of the present disclosure. FIG. 1C is a bird's eye view of the memory cell structure of FIG. 1B. Elements of the memory cell structures of FIG. 1A and FIG. 1B are identical, except for the cross-sectional shapes from the top view. In FIG. 1A, the memory cell structure has a ring-shaped cross-section from the top view. In FIG. 1B, the memory cell structure has a half-ring shaped cross-section from the top view. The identical and/or similar elements of FIG. 1A and FIG. 1B are designated with the same and/or similar reference numerals, and the configuration details of the identical components/layers are not redundantly described. According to the embodiments as illustrated above, since the selector (i.e. the selector layer 14/14') are positioned at the an outer surface 12a of the memory material layer 12, the area of the selector (i.e. the selector layer 14/14') is larger than the area of the memory material layer 12, so that the current density in the selector will be lower during operation, thereby preventing too much heat generated on the selector area.

Figure 2A:
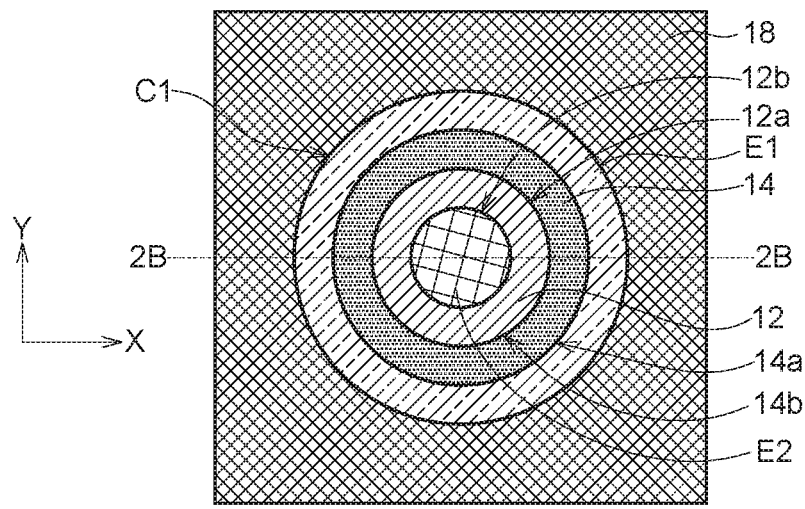
FIG. 2A is a top view of a string of memory cell structures of a three-dimensional (3D) semiconductor device according to one embodiment of the present disclosure.
Figure 2B:
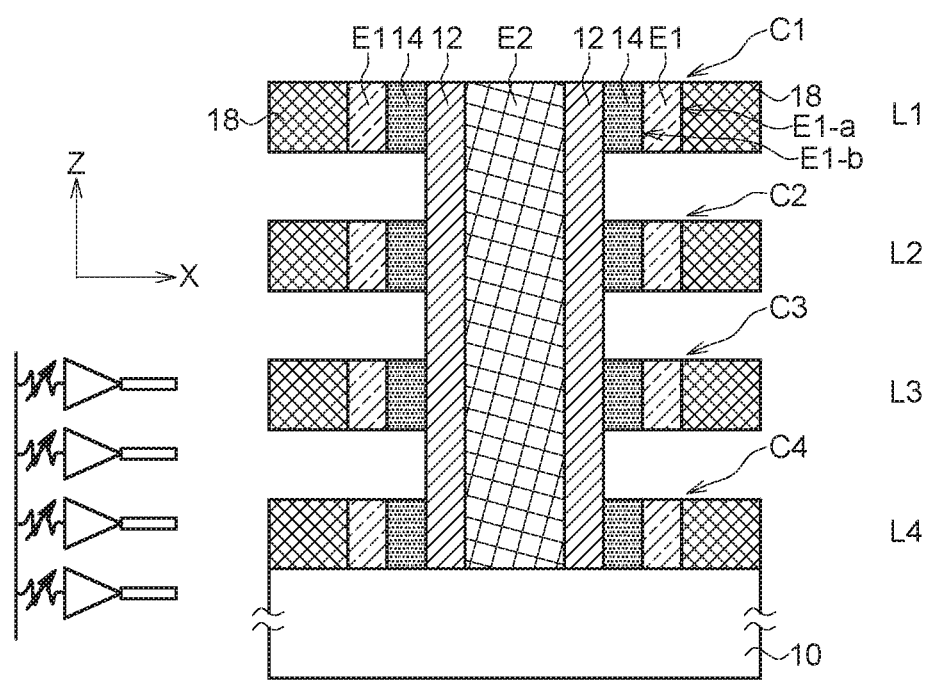
FIG. 2B is a cross-sectional view of the string of memory cell structures of FIG. 2A according to one embodiment of the present disclosure, wherein an equivalent circuit diagram is also depicted.
Figure 2C:
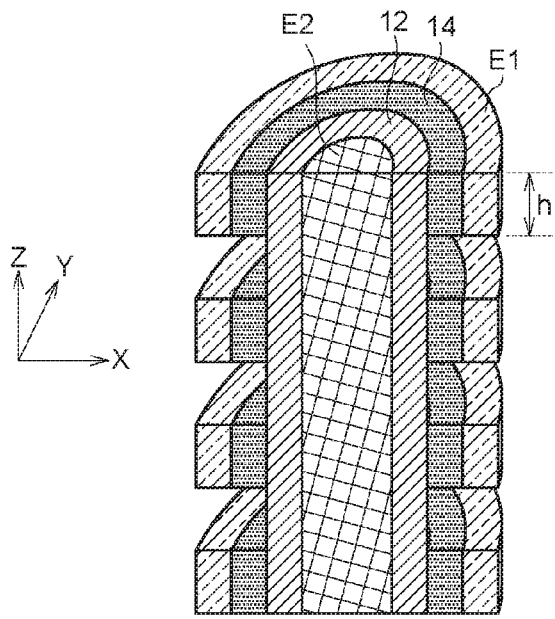
FIG. 2C is a bird's eye view of the string of the memory cell structures of FIG. 2B.

FIG. 2A is a top view of a string of memory cell structures of a three-dimensional (3D) semiconductor device according to one embodiment of the present disclosure. FIG. 2B is a cross-sectional view of the string of memory cell structures of FIG. 2A according to one embodiment of the present disclosure, wherein an equivalent circuit diagram is also depicted. FIG. 2C is a bird's eye view of the string of the memory cell structures of FIG. 2B. As shown in FIG. 2B and FIG. 2C, four memory cell structures C1, C2, C3 and C4 are exemplified for forming a string of memory cell structures and belong to four different memory layers L1, L2, L3 and L4. Each memory layer is separated from the other memory layer by an interlayer insulation layer (not shown in FIG. 2B and FIG. 2C, but shown as the oxide layer 501 by FIG. 5A-FIG. 20B in the forming method described later). As shown in FIG. 2B and FIG. 2C, each of the memory layers (ex: L1, L2, L3 and L4 parallel to each other) comprises a conductive layer 18 electrically connecting the first electrode layer E1. For example, the conductive layer 18 in each memory layer direct contacts the outer surface E1-a of the first electrode layer E1. Also, the second electrode layer E2 is formed to penetrate a multi-layered stack structure (comprising the memory layers such as L1, L2, L3 and L4) and extended in a vertical direction (such as along the Z-direction) with respect to the substrate 10. Accordingly, in the string of the memory cell structures (ex: C1, C2, C3 and C4), the second electrode layer E2 connects the memory cell structures (ex: C1, C2, C3 and C4) formed in the different memory layers (ex: L1, L2, L3 and L4).

In one embodiment, the second electrode layer E2/E2', the memory material layer 12/12', the selector layer 14/14' and the first electrode layer E1/E1' have the ring-shaped cross-sections from the top view, or the half-ring shaped cross-sections from the top view, or other appropriate cross-sectional shapes. In one embodiment, the selector layer 14/14' directly contacts and surrounds the outer surface 12a of the memory material layer 12/12', and the first electrode layer E1/E1' directly contacts the selector layer 14/14' by surrounding the outer surface 14a of the selector layer 14/14'. Also, in one embodiment, the conductive layer 18 and the selector layer 14 in each of the memory cell structures directly contact an outer surface E1-*a* of the first electrode layer E1 and the inner surface E1-*b* of the first electrode layer E1, respectively (as shown in FIG. 2B).

Figure 3A:
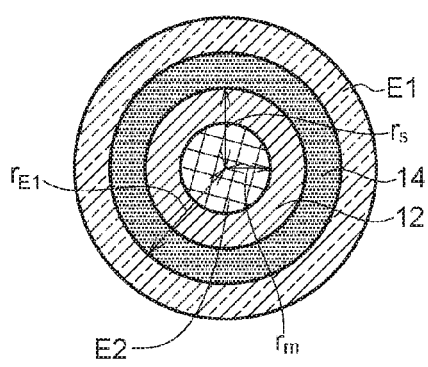
FIG. 3A depicts a top view of a single memory cell structure labeled with the radius $r_m$, $r_s$ and $r_{E1}$ of the related elements according to one embodiment of the present disclosure.

According to the embodiment, a memory cell structure has a selector part and a memory part, and the selector surface area is larger than the memory surface area. FIG. 3A depicts a top view of a single memory cell structure labeled with the radius $r_m$, $r_s$ and $r_{E1}$ of the related elements according to one embodiment of the present disclosure. As shown in FIG. 3A, the selector layer 14 directly contacts and electrically connects the memory material layer 12, wherein the radius $r_m$ and the height h (i.e. the height h of the memory layer in FIG. 2C) define a memory surface area Ac (ex: $2\pi r_m h$); the radius $r_s$ and the height h define a selector surface area As (ex: $2\pi r_s h$). Both of the memory surface area Ac and the selector surface area As are defined by the minimum surfaces which are vertical to the current flow direction. According to the embodiment, the selector surface area As is larger than the memory surface area Ac (As>Ac), and a ratio of As to Ac (As/Ac) is greater than 1.2.

Also, the first electrode layer E1 has an inter-ring surface area $A_{E1}$, defined by the radius $r_{E1}$ and the height h (i.e. the height h of the memory layer in FIG. 2C)(ex: $A_{E1}=2\pi r_{E1} h$). The second electrode layer E2 has an outer-ring surface area $A_{E2}$, which can be defined by the inter ring surface area of the memory material layer 12 (ex: $A_{E2}=2\pi r_m h=Ac$) ($A_{E1}>A_{E2}$). In one embodiment, a ratio of the inter-ring surface area $A_{E1}$ of the first electrode layer E1 to the outer-ring surface area $A_{E2}$ of the second electrode layer E2 is greater than 2 (i.e. ($A_{E1}/A_{E2}$)>2).

Figure 3B:
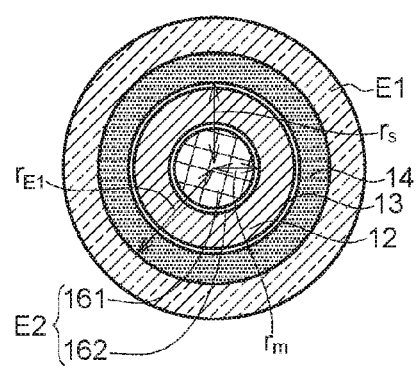
FIG. 3B depicts a top view of another single memory cell structure labeled with the radius $r_m$, $r_s$ and $r_{E1}$ of the related elements according to one embodiment of the present disclosure.

In some embodiments, the second electrode layer E2 can be a single layer (such as W) or a multi-layer. In one example, the second electrode layer E2 is a multi-layer including a main layer 161 (such as W) and a barrier layer 162 (such as TiN). Also, in some embodiments, another barrier layer 13 (such as TiN) can be formed between the memory material layer 12 and the selector layer 14. FIG. 3B depicts a top view of another single memory cell structure labeled with the radius $r_m$, $r_s$ and $r_{E1}$ of the related elements according to one embodiment of the present disclosure. As shown in FIG. 3B, the barrier layer 13 is formed between the selector layer 14 and the memory material layer 12. The radius $r_m$, $r_s$ and $r_{E1}$ of the related elements for calculating the surface areas have been labeled In FIG. 3B if the memory cell structure includes the barrier layers 13 and/or 162. Calculations of the surface areas of the related elements defined by the radius $r_m$, $r_s$ and $r_{E1}$ are identical to the expressions above, and not redundantly repeated.

In the practical application, a three-dimensional (3D) semiconductor device comprises a multi-layered stack structure formed above a substrate, and the multi-layered stack structure may include several memory layers (ex: L1, L2, L3 and L4) parallel to each other and separated by the interlayer insulation layers (such as the oxide layers). According to the embodiments, the memory cell structures formed at each of the memory layers (ex: L1, L2, L3 and L4) can be arranged in an array with multi-rows and multi-columns. FIG. 4A is a top view of a memory layer of a multi-layered stack structure according to one embodiment of the disclosure. FIG. 4B is an equivalent circuit diagram of FIG. 4A. FIG. 4C is a top view of one memory layer of a multi-layered stack structure according to another embodiment of the disclosure. FIG. 4D is an equivalent circuit diagram of FIG. 4C. As shown in FIG. 4A and FIG. 4C, the memory cell structures formed at each of the memory layers arranged in an array with four rows and four columns are exemplified. It is noted that the row and column numbers can be changed depending on the requirements of the practical applications.

As shown in FIG. 4A and FIG. 4C, the conductive layer 18 in each of the memory layers (such as in the first memory layer L1) electrically connects the adjacent memory cell structures by extending in a parallel direction with respect to the substrate beneath the multi-layered stack structure, such as extending in the X direction of a XY-plane. For example, in each of the memory layers (such as in the first memory layer, denoted as "L1"), the memory cell structures arranged in the same row are electrically connected by the conductive layer 18, wherein the conductive layer 18 has at least a slit formed between the memory cell structures arranged in the different rows. As shown in FIG. 4C, the conductive layer has three slits SL1, SL2 and SL3 respectively formed between the memory cell structures arranged in the first row and the second row, arranged in the second row and the third row, and arranged the third row and the fourth row. Alternatively, in some examples, in each of the memory layers, the memory cell structures arranged in the adjacent rows and the adjacent columns of the array are electrically connected by the conductive layer 18. As shown in FIG. 4A, in each of the memory layers, the memory cell structures arranged in the array with multi-rows (ex: four rows) and multi-columns (ex: four columns) are electrically connected by the conductive layer 18. Accordingly, the conductive layer 18 as shown (but not limited) in FIG. 4A and FIG. 4C provides many current paths for the selected memory cell during operation, thereby decreasing the loading (resistance R). Configuration of the conductive layer 18 in FIG. 4A provides more current paths than that in FIG. 4C, so that the loading of FIG. 4A would be lower than the loading of FIG. 4C during operation. Also, in one embodiment, the conductive layer 18 in the memory layer is connected to a layer decoder.

Additionally, FIG. 4A and FIG. 4C merely demonstrate the memory cell structures arranged at one memory layer (such as the first layer L1 of the memory layers parallel to the XY-plane), but a 3D semiconductor device comprises a multi-layered stack structure including several memory layers (ex: L1, L2, L3 and L4 parallel to each other and disposed vertically along the Z-direction as shown in FIG. 2B and FIG. 2C), and each memory layer comprises one conductive layer 18 (and the connections of the conductive layer 18 for the adjacent memory cell structures are the same or similar as the descriptions above), wherein the conductive layers respectively formed in the memory layers are separated by the interlayer insulation layers (such as the oxide layers). Also, those conductive layers 18 formed in the memory layers are connected to layer decoders, respectively. Please refer to FIG. 2B and FIG. 4A/FIG. 4C.

One of the applicable manufacturing processes is provided for illustration. FIG. 5A-FIG. 20B depict a method for forming a 3D semiconductor device according to one embodiment of the disclosure, wherein the figures labeled with "A" represent the configurations from the top view, and the figures labeled with "B" represent the configurations from the cross-sectional view. It is noted the method illustrated in FIG. 5A-FIG. 20B is not provided for limiting the disclosure, and the steps and structural details can be modified or adjusted according to the actual designs and requirements of the practical applications. Additionally, FIG. 5A to FIG. 14B merely depict steps for forming one memory cell structure for clear illustration (wherein FIG. 5B to FIG. 14B are cross-sectional views of FIG. 5A to FIG. 14A along the cross-sectional line 5X-5X), while FIG. 15A-FIG. 20B depict the following steps for forming plural memory cell structures arranged in more than 1 row and more than 1 column, such as four memory cell structure arranged in 2 rows and 2 columns (wherein FIG. 15B to FIG. 20B are cross-sectional views of FIG. 15A to FIG. 20A along the cross-sectional line 5Y-5Y).

As shown in FIG. 5A and FIG. 5B, a substrate 10 is provided, and several oxide layers 501 (such as the silicon oxide layers) and several nitride layers 503 (such as the silicon nitride layers) are formed alternately on the substrate 10. Positions of the nitride layers 503 correspond to the memory layers formed later (such as L1, L2, L3 and L4 shown in FIG. 2B described above or shown in FIG. 14B described later). Also, the oxide layers 501 function as the interlayer insulation layers for separating the memory layers stacked along the vertical direction (ex: Z-direction).

As shown in FIG. 6A and FIG. 6B, the stack of the oxide layers 501 and the nitride layers 503 are patterned to form a hole 50h. Afterwards, the nitride layers 503 are pulled back to form the first recess regions 50R1, wherein the first recess regions 50R1 beside the patterned nitride layers 503' communicate the hole 50h, as shown in FIG. 7A and FIG. 7B. Subsequently, the first electrode layer E1 and the selector layer of the memory cell structure in each of the memory layer will be formed in the first recess regions 50R1.

As shown in FIG. 8A and FIG. 8B, a thin dielectric layer 504 can be optionally deposited on the sidewalls of the oxide layers 501 and the patterned nitride layers 503' within the hole 50h and the first recess regions 50R1. Material examples of the thin dielectric layer 504 include silicon oxide, aluminum oxide and other suitable materials. In one embodiment, it is assumed that the thin dielectric layer 504 and the oxide layers 501 contain the same material, and the top view drawing as shown in FIG. 8A and drawings thereafter omit the thin dielectric layer 504 for clearly showing the top-view configuration of the embodied memory cell structure.

As shown in FIG. 9A and FIG. 9B, a first electrode material layer 52 (such as a TiN layer) is filled into the hole 50h and the first recess regions 50R1. Afterwards, the first electrode material layer 52 is pulled back to form the several first electrode layers E1 respectively within the first recess regions 50R1 in the memory layers (ex: L1, L2, L3 and L4), as shown in FIG. 10A and FIG. 10B.

Figure 11A:
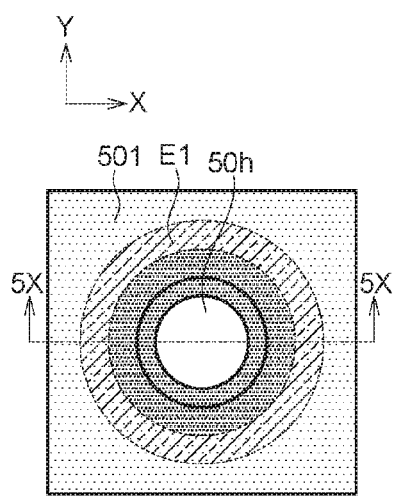
Figure 11B:
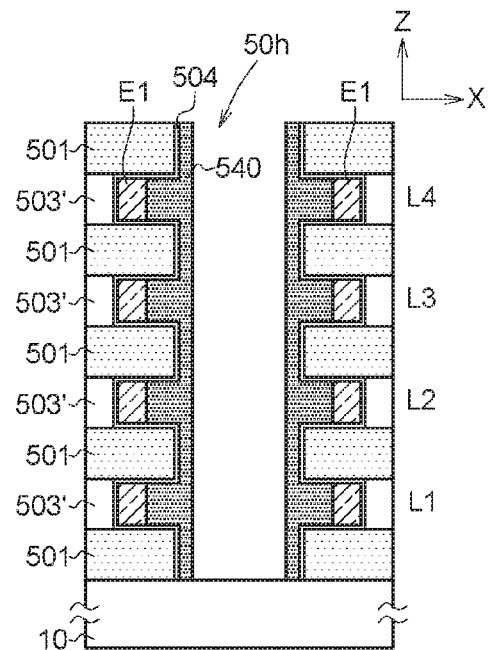
Figure 12A:
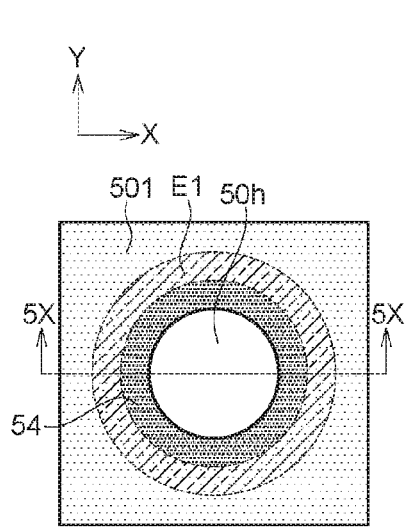
Figure 12B:
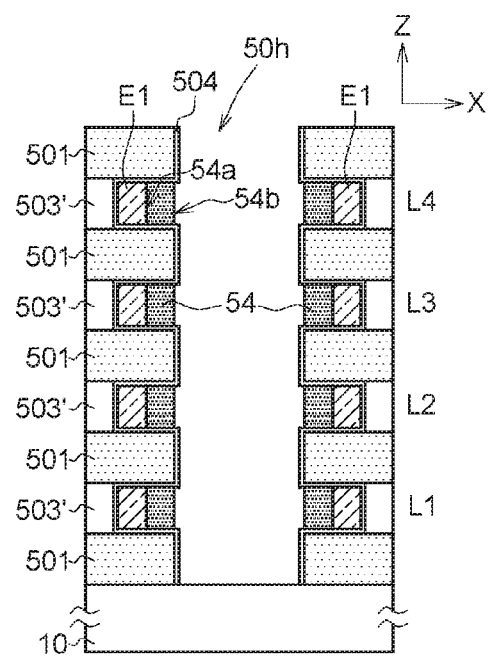

As shown in FIG. 11A and FIG. 11B, a selector material layer 540 (containing a diode, a threshold switching material, or any suitable materials) is filled into the hole 50h and the first recess regions 50R1. Afterwards, the selector material layer 540 is pulled back to form the several selector layers 54 respectively within the first recess regions 50R1 in the memory layers (ex: L1, L2, L3 and L4), as shown in FIG. 12A and FIG. 12B. In one example, the outer surface 54a of the selector layer 54 directly contacts the first electrode layer E1 in each of the memory layers. In one (but not limited) example, the inner surface 54b of the selector layer 54 in each of the memory layers is inside the first recess region 50R1, and could be substantially aligned with the sidewalls 501b of the oxide layers 501 (or aligned with the sidewalls 504b of the thin dielectric layer 504 if the thin dielectric layer 504 exists) at most.

Figure 13A:
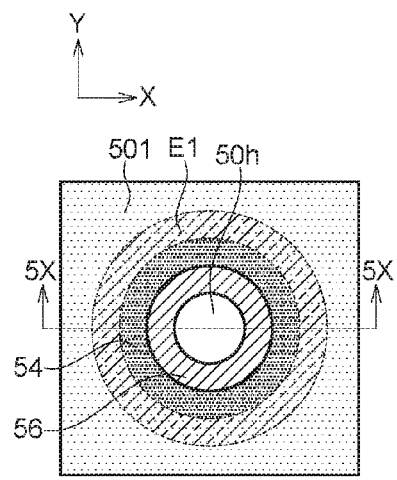
Figure 13B:
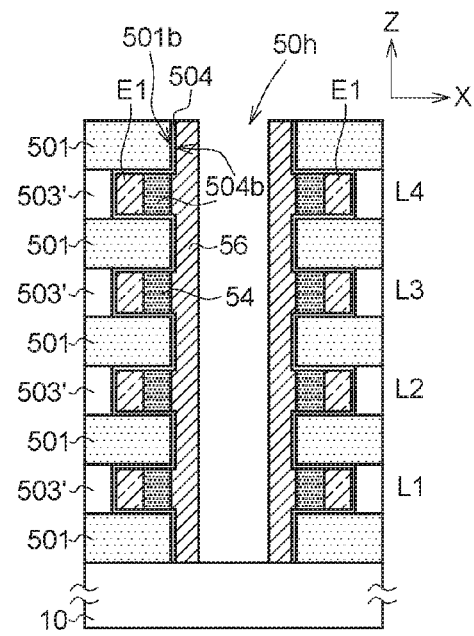
Figure 14A:
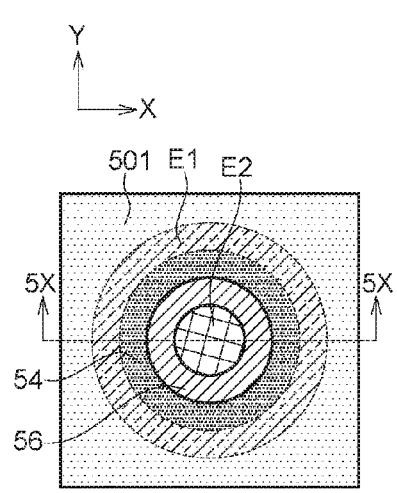
Figure 14B:
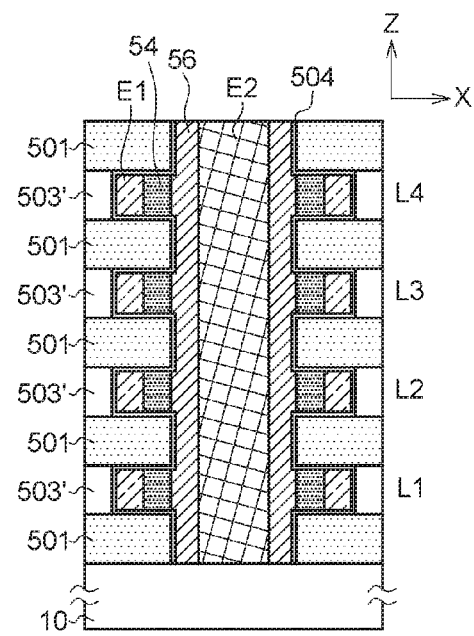

As shown in FIG. 13A and FIG. 13B, a memory material layer 56 (could be phase-change memory (PCM), resistive random-access memory (ReRAM) or any other suitable memory) is filled into the hole 50h and extending along the vertical direction (ex: Z-direction) with respect to the substrate 10. In one (but not limited) example, the memory material layer 56 directly contacts the selector layers 54 respectively in the memory layers (ex: L1, L2, L3 and L4), and directly contacts the sidewalls 501b of the oxide layers 501 (or the sidewalls 504b of the thin dielectric layer 504 if the thin dielectric layer 504 exists). Afterwards, a second electrode material layer (could be a single layer or a multi-layer, such as TiN/W or other suitable materials) full fills the hole 50h for forming the second electrode E2, as shown in FIG. 14A and FIG. 14B.

FIG. 15A-FIG. 20B depict the following steps for forming plural memory cell structures arranged in plural rows and plural columns, such as 4 memory cell structure arranged in 2 rows and 2 columns (as shown in FIG. 15A to FIG. 20A), to exemplify the conductive layers 18 for connecting adjacent memory cell structures, such as connecting the memory cell structures arranged in the same row.

Figure 15A:
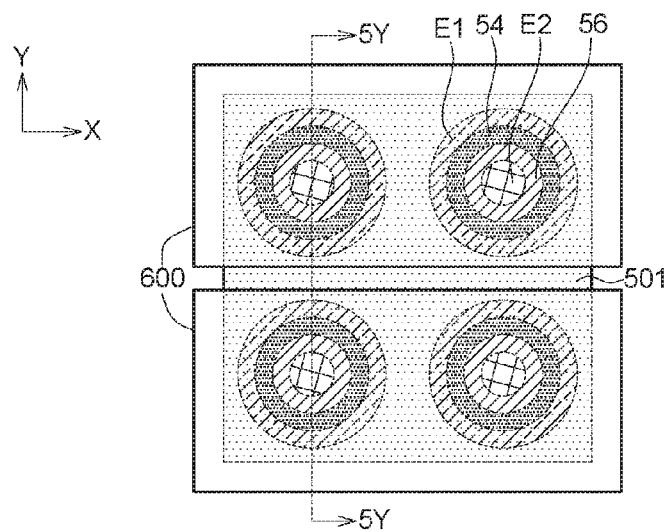
Figure 15B:
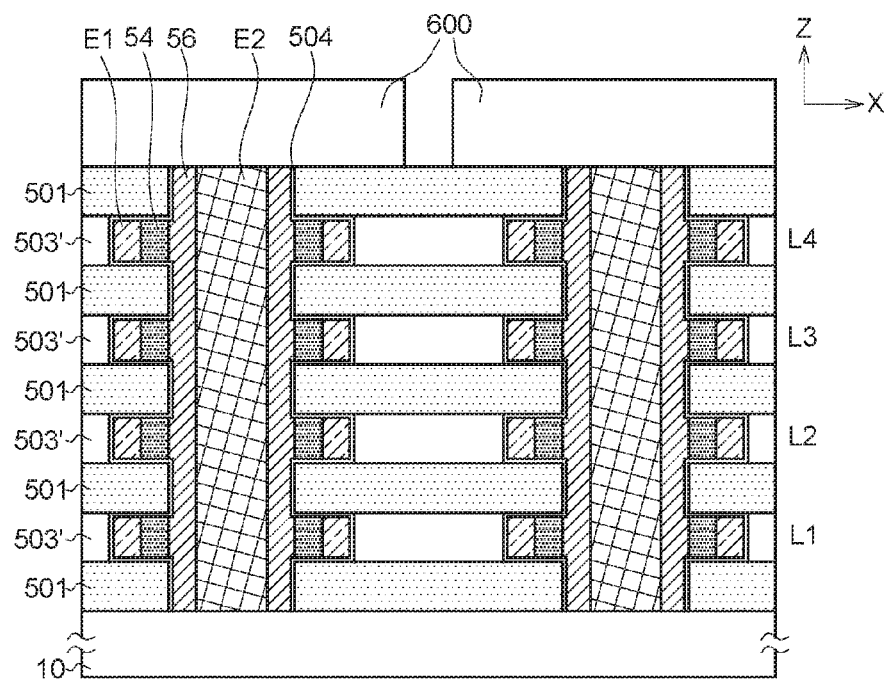
Figure 16A:
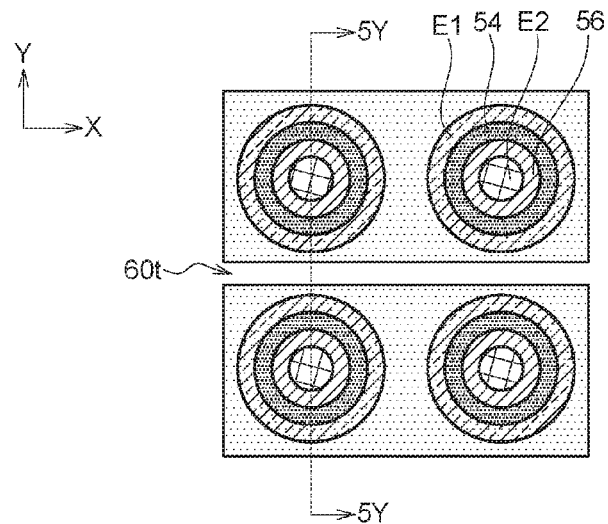
Figure 16B:
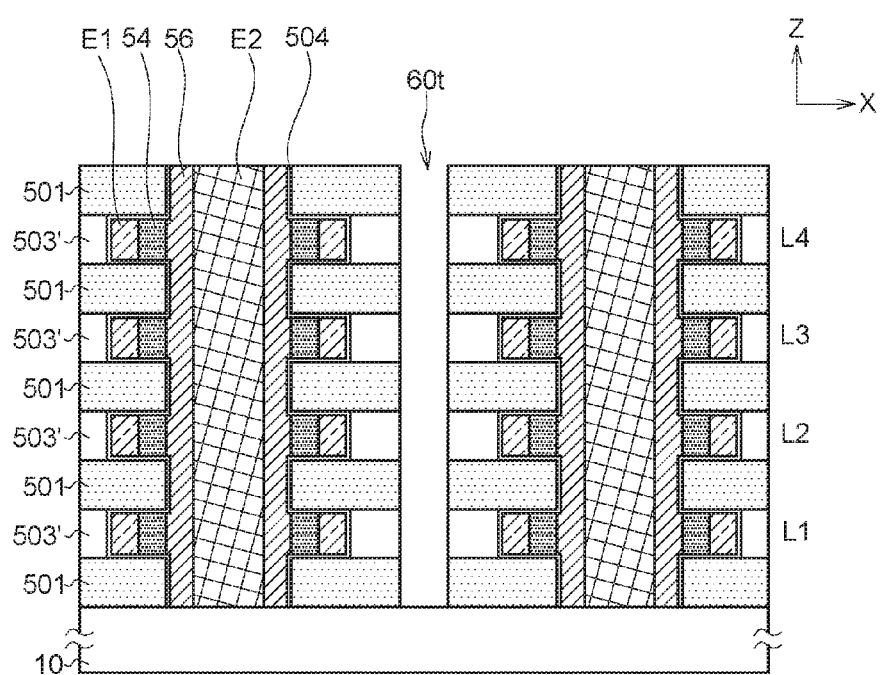

As shown in FIG. 15A and FIG. 15B, a trench pattern such as a photoresist (PR) pattern 600 is formed on the multi-layered stack structure (including several memory layers such as L1, L2, L3 and L4 and the interlayer insulation layers for separating the memory layers). Then, a trench 60t is formed to open through the multi-layered stack structure according to the photoresist (PR) pattern 600, as shown in FIG. 16A and FIG. 16B. In one example, the trench 60t is extended along a direction towards a layer decoder.

Figure 17A:
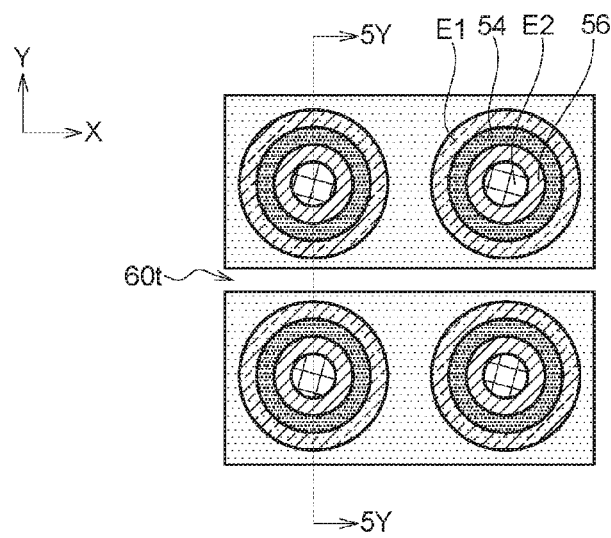
Figure 17B:
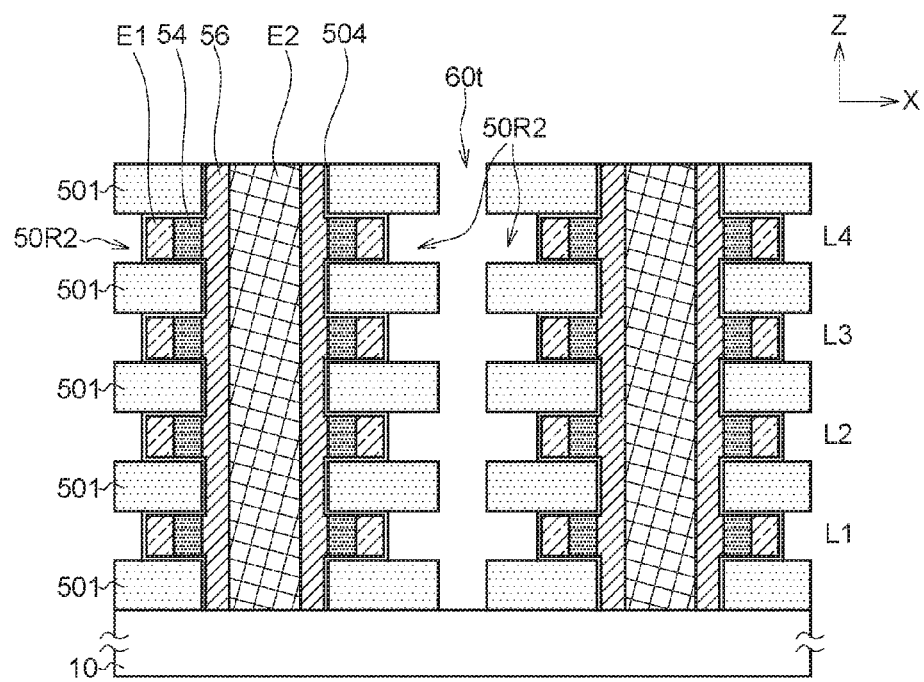
Figure 18A:
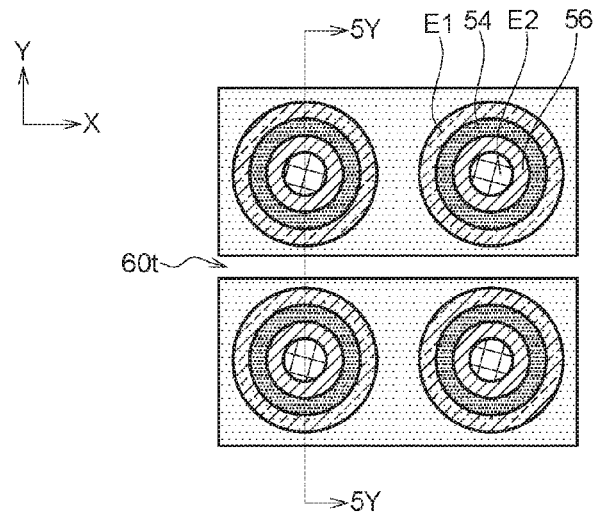
Figure 18B:
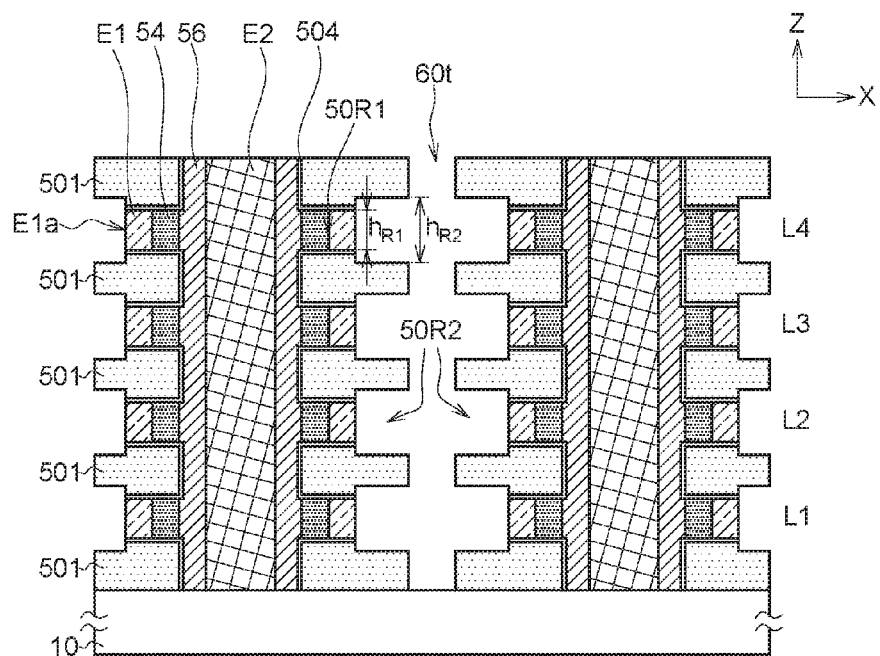
Figure 19A:
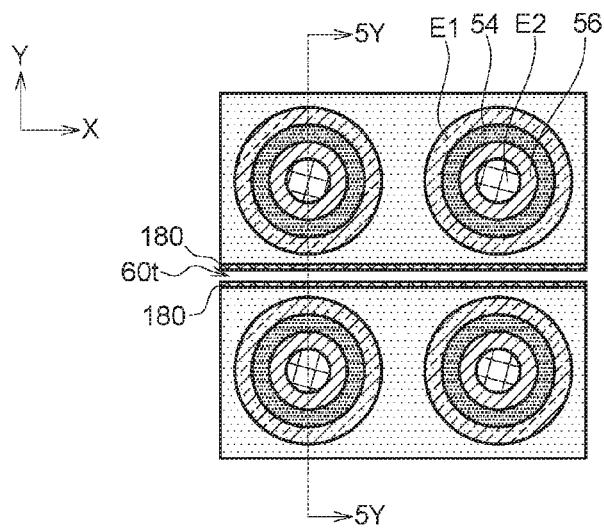
Figure 19B:
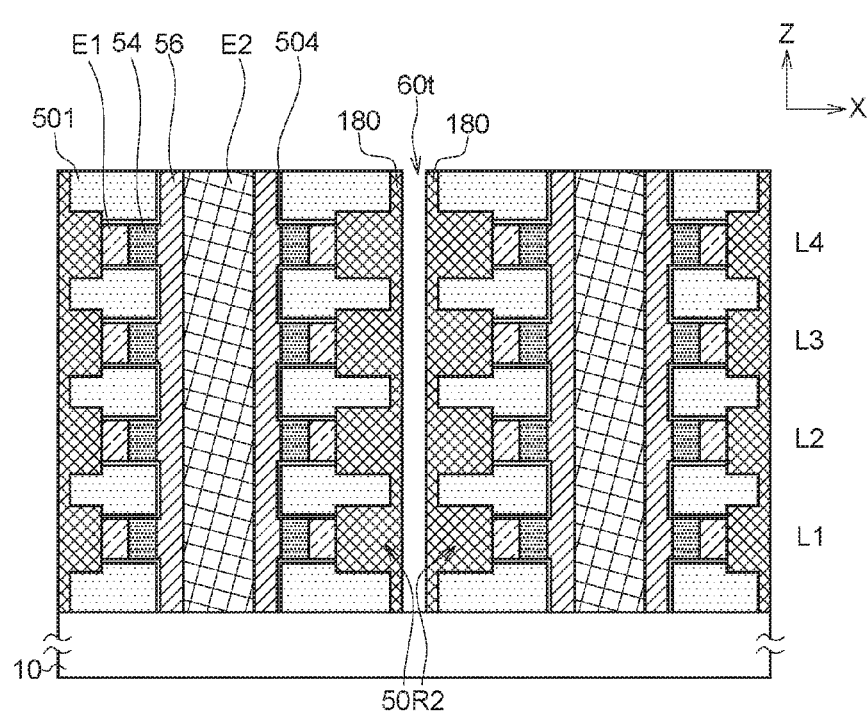
Figure 20A:
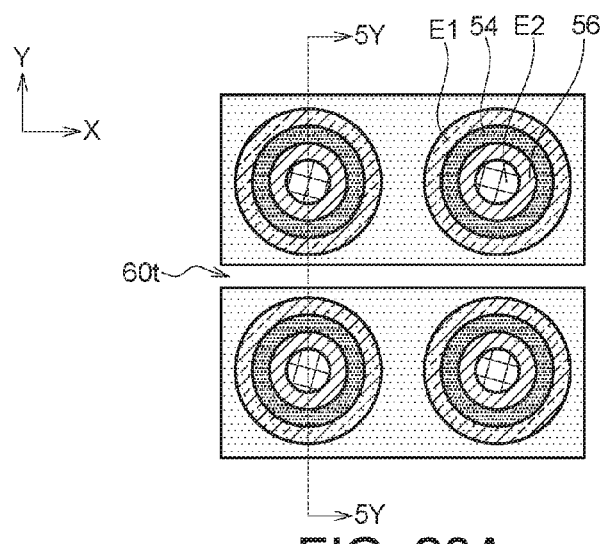
Figure 20B:
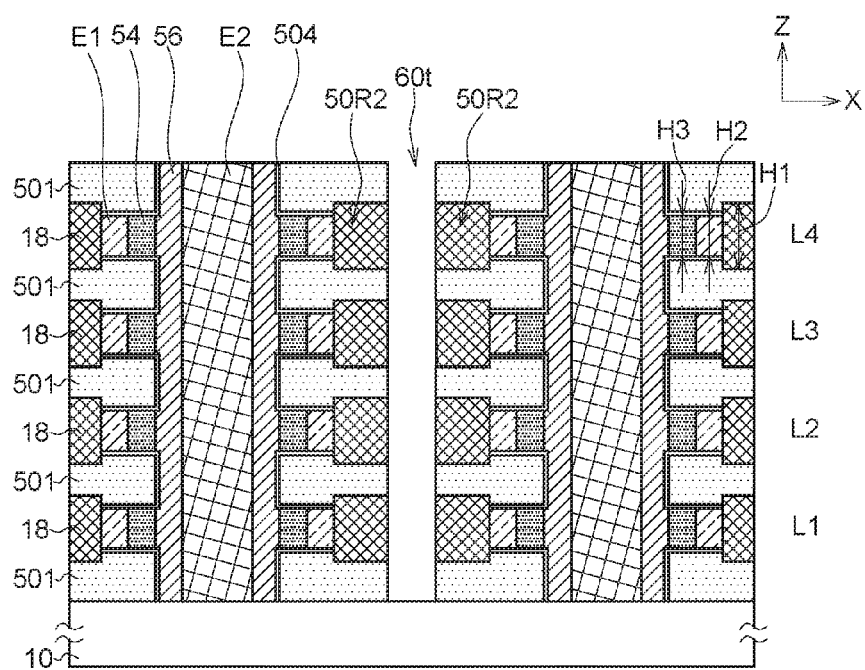

As shown in FIG. 17A and FIG. 17B, the patterned nitride layers 503' of the memory layers are removed to form the second recess regions 50R2 respectively in the memory layers. Then, as shown in FIG. 18A and FIG. 18B/FIG. 18C, the portions of the thin dielectric layer 504 towards the second recess regions 50R2 are removed to expose the first electrode layers E1 in the memory layers, such as the outer surfaces E1-a of the first electrode layers E1 being exposed to the second recess regions 50R2. Afterwards, as shown in FIG. 19A and FIG. 19B, a conductive material layer 180 is filled into the second recess regions 50R2 through the trench 60t, followed by isotropic etching to reveal the trench 60t, so as to form the conductive layers 18 within the second recess regions 50R2 of the memory layers, as shown in FIG. 20A and FIG. 20B. The conductive material layer 180 is made by any suitable single or multiple conductive materials such as TiN/W for electrically connecting the adjacent memory cell structures (ex: connecting the first electrode layers E1 of the adjacent memory cell structures). The electrical connection between the conductive layer 18 and the adjacent memory cell structures can be achieved by the ways demonstrated in FIG. 4A or FIG. 4C or other suitable connection ways, and the disclosure is not limited to those demonstrated examples.

Additionally, the first recess regions 50R1 (for forming the first electrode layers E1 and the selector layers 54) and the second recess regions 50R2 (for forming the conductor layers 18) may have the same height or different heights. As shown in FIG. 18B, the first recess region 50R1 has a first height $h_{R1}$ and the second recess region 50R2 has a second height $h_{R2}$, wherein the second height $h_{R2}$ is larger than the first height $h_{R1}$. Therefore, in each memory layer, the conductive layer 18 has a first thickness H1 in the vertical direction (i.e. Z-direction), the first electrode layer E1 has a second thickness H2 in the vertical direction, and the selector layer 54 has a third thickness H3 in the vertical direction, wherein the second thickness H2 is equal to the third thickness H3 and the first thickness H1 is larger than the second thickness H2 after formation of the conductive layers 18, as shown in FIG. 20B.

Figure 18C:
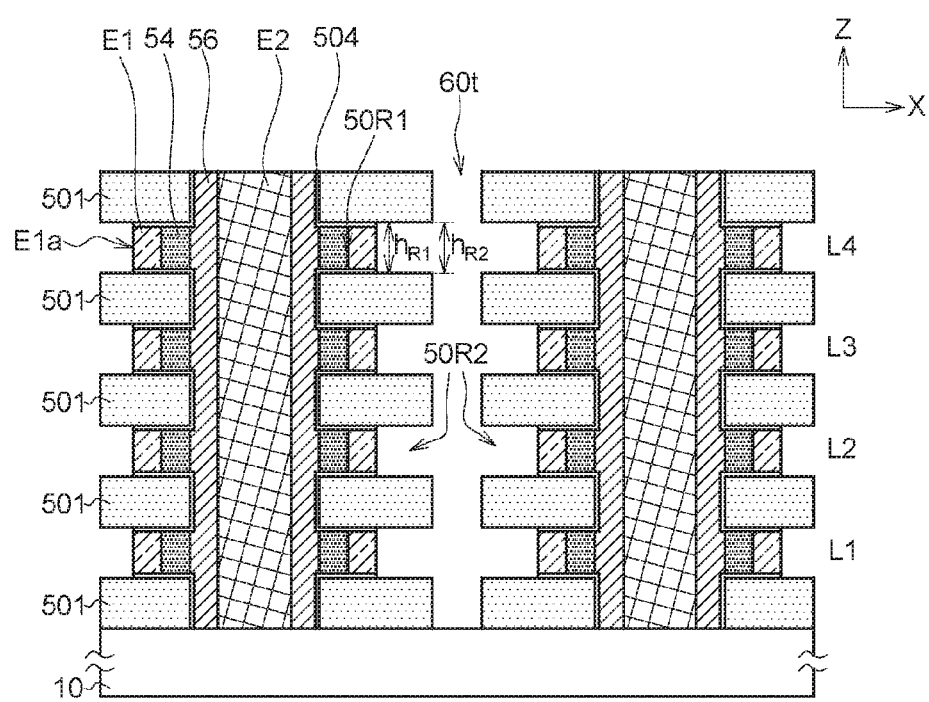

Alternatively, the first recess region 50R1 has a first height $h_{R1}$ and the second recess region 50R2 has a second height $h_{R2}$, wherein the second height $h_{R2}$ can be equal to the first height $h_{R1}$, as shown in FIG. 18C. Therefore, the first thickness H1 of the conductive layer would be equal to the second thickness H2 of the first electrode layer E1 and equal to the third thickness H3 of the selector layer 54.

Figure 21:
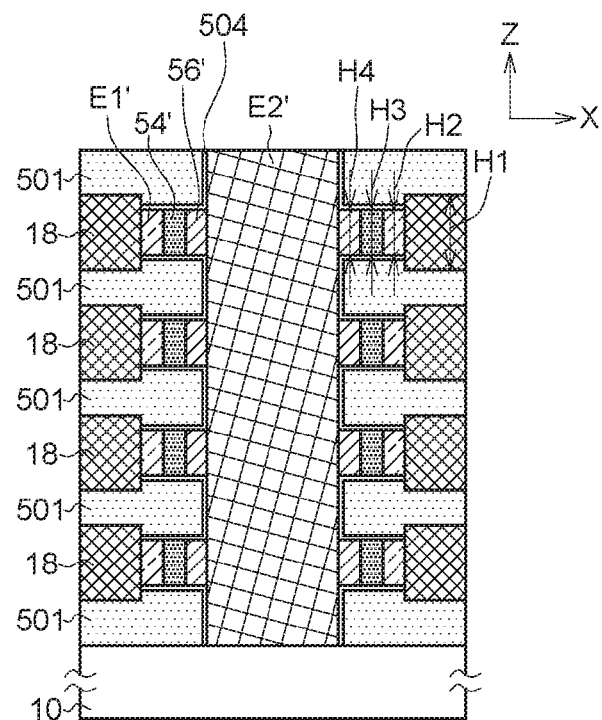
FIG. 21 is a cross-sectional view of a further 3D semiconductor device according to one embodiment of the disclosure.

Moreover, according to the embodiment above, the memory material layer 12/12'/56 are formed in the hole 50h and extending with the second electrode layer E2 along the vertical direction (ex: Z-direction), as shown in FIG. 2B and FIG. 20B. However, the disclosure is not limited thereto. FIG. 21 is a cross-sectional view of a further 3D semiconductor device according to one embodiment of the disclosure. As shown in FIG. 21, the memory material layer 56' can be retracted inside the first recess region 50R1, which means that memory material layer 56', the selector layer 54' and the first electrode layer E1' are formed within the first recess region 50R1 while the second electrode layer E2' is formed in the hole 50h penetrating the multi-layered stack structure. Therefore, the memory material layer 56' has a fourth thickness H4 in the vertical direction, and the fourth thickness H4 of the memory material layer 56' is equal to the third thickness H3 of the selector layer 54', as shown in FIG. 21.

Figure 22:
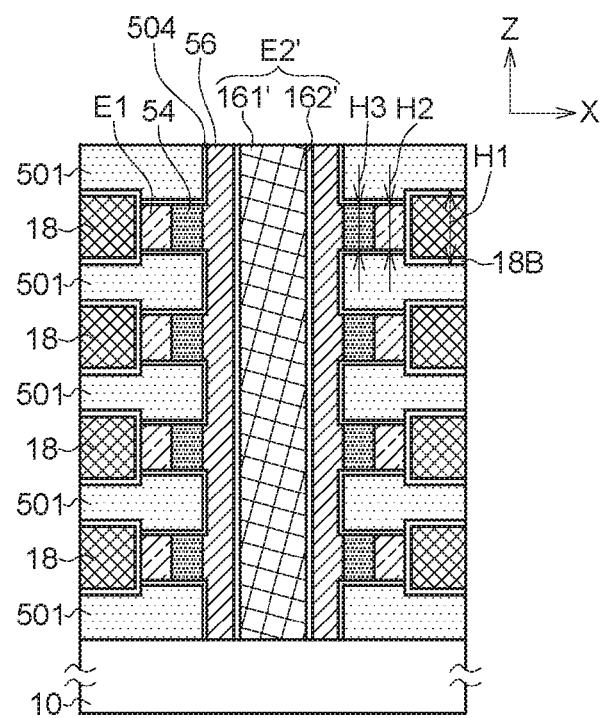
FIG. 22 is a cross-sectional view of an enlarged portion of another 3D semiconductor device according to one embodiment of the disclosure.

Moreover, in some embodiments, the second electrode layer E2 can be a multi-layer with barrier (ex: 162 in FIG. 3B, or 162' in FIG. 22). Also, a barrier layer (ex: 18B in FIG. 22) can be optionally formed in the second recess regions 50R2 before forming the conductive layers 18. FIG. 22 is a cross-sectional view of another 3D semiconductor device according to one embodiment of the disclosure. As shown in FIG. 22, the second electrode layer E2 is a multi-layer including a main layer 161' (such as W) and a barrier layer 162' (such as TiN); and another barrier layer 18B is formed in the second recess regions 50R2, wherein the conductive layers 18 contacts the barrier layer 18B.

According to the aforementioned descriptions, the selector layer of the embodied memory cell structure is disposed at the outside of the memory material layer, thereby reducing the heat generation of the selectors. Thus, the reliability and performance of the 3D semiconductor device during operation can be significantly improved. Also, the adjacent memory cell structures in the same memory layer (such as the memory cell structures arranged in the same row or arranged in an array with multi-rows and multi-columns) are electrically connected by the conductive layer 18 (such as a metal layer), thereby providing more current paths to the selected memory cell and efficiently decreasing the loading (resistance R) during operation.

Other embodiments with different configurations of known elements in the device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the details of manufacturing steps could be adjusted according to the requirements/actual needs of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
   a substrate;
   a multi-layered stack structure formed above the substrate and comprising memory layers parallel to each other and separated by interlayer insulation layers;
   memory cell structures formed at each of the memory layers by arranging in an array with multi-rows and multi-columns, and one of the memory cell structures comprising:
      a memory material layer;
      a selector layer, formed at an outer surface of the memory material layer and connected to the memory material layer;
      a first electrode layer, formed at an outer surface of the selector layer and electrically connected to the selector layer;
      a dielectric layer, disposed between the select layer and one of the interlayer insulation layers adjacent to the select layer; and
      a second electrode layer, formed at an inner surface of the memory material layer and connected to the memory material layer, wherein the second electrode layer is formed to penetrate the multi-layered stack structure and extended in a vertical direction with respect to the substrate,
   wherein each of the memory layers comprises a conductive layer electrically connecting the first electrode layer, and the conductive layer electrically connects the adjacent memory cell structures by extending in a parallel direction with respect to the substrate.

2. The 3D semiconductor device according to claim 1, wherein in each of the memory layers, the memory cell structures arranged in the same row are electrically connected by the conductive layer.

3. The 3D semiconductor device according to claim 2, wherein in each of the memory layers, the conductive layer has at least a slit formed between the memory cell structures arranged in the different rows.

4. The 3D semiconductor device according to claim 1, wherein in each of the memory layers, the memory cell structures arranged in the adjacent rows and the adjacent columns of the array are electrically connected by the conductive layer.

5. The 3D semiconductor device according to claim 1, wherein in each of the memory layers, the memory cell structures arranged in the array with multi-rows and multi-columns are electrically connected by the conductive layer.

6. The 3D semiconductor device according to claim 1, wherein a plurality of the conductive layers respectively formed in the memory layers are separated by the interlayer insulation layers.

7. The 3D semiconductor device according to claim 6, wherein the plurality of the conductive layers are connected to layer decoders, respectively.

8. The 3D semiconductor device according to claim 1, wherein in each of the memory cell structures, the memory material layer has a ring-shaped cross-section from a top view, and the selector layer directly contacts and surrounds the outer surface of the memory material layer.

9. The 3D semiconductor device according to claim 1, wherein in each of the memory cell structures, the selector layer has a ring-shaped cross-section from a top view, and the first electrode layer directly contacts the selector layer by surrounding the outer surface of the selector layer.

10. The 3D semiconductor device according to claim 1, wherein in each of the memory cell structures, the conductive layer and the selector layer directly contact an outer surface of the first electrode layer and the inner surface of the first electrode layer, respectively.

11. The 3D semiconductor device according to claim 10, wherein the conductive layer has a first thickness in the vertical direction, the first electrode layer has a second thickness in the vertical direction, and the selector layer has a third thickness in the vertical direction, wherein the second thickness is equal to the third thickness, and the first thickness is equal to or larger than the second thickness.

12. The 3D semiconductor device according to claim 11, wherein the memory material layer has a fourth thickness in the vertical direction, and the third thickness of the selector layer is equal to the fourth thickness of the memory material layer.

13. The 3D semiconductor device according to claim 1, wherein the memory material layers of the memory cell structures formed at the different memory layers are separated by the interlayer insulation layers.

14. The 3D semiconductor device according to claim 1, wherein the memory material layers of the memory cell structures formed at the different memory layers are connected to each other by the second electrode layer in the vertical direction with respect to the substrate.

15. The 3D semiconductor device according to claim 1, wherein the selector layer has a selector surface area As, the memory material layer has a memory surface area Ac, and the selector surface area As is larger than the memory surface area Ac, and a ratio of As to Ac (As/Ac) is greater than 1.2.

16. The 3D semiconductor device according to claim 1, wherein the first electrode layer and the second electrode layer have ring-shaped cross-sections from a top view, and the first electrode layer has an inter-ring surface area $A_{E1}$ while the second electrode layer has an outer-ring surface area $A_{E2}$, wherein a ratio of $A_{E1}$ to $A_{E2}$ is greater than 2.

* * * * *